(12) United States Patent
Gibbons et al.

(10) Patent No.: US 7,844,021 B2
(45) Date of Patent: Nov. 30, 2010

(54) METHOD AND APPARATUS FOR CLOCK SKEW CALIBRATION IN A CLOCK AND DATA RECOVERY SYSTEM USING MULTIPHASE SAMPLING

(75) Inventors: Tom Gibbons, Macungie, PA (US); Kenneth W. Paist, Spring City, PA (US); Mark Trafford, Fleetwood, PA (US); William B. Wilson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 1066 days.

(21) Appl. No.: 11/529,002

(22) Filed: Sep. 28, 2006

(65) Prior Publication Data

US 2008/0080649 A1   Apr. 3, 2008

(51) Int. Cl.
 *H04L 7/00* (2006.01)
(52) U.S. Cl. ...................................... 375/371
(58) Field of Classification Search ................. 375/224, 375/226, 354, 355, 371, 372, 374, 375, 376; 327/100, 141, 144, 146–153, 162, 163
See application file for complete search history.

(56) References Cited

U.S. PATENT DOCUMENTS

| | | | |
|---|---|---|---|
| 4,074,358 A * | 2/1978 | Caputo et al. ................ | 702/69 |
| 6,560,304 B1 * | 5/2003 | Yoon et al. ................... | 375/371 |
| 2003/0123591 A1 * | 7/2003 | Walker ....................... | 375/355 |
| 2004/0030513 A1 * | 2/2004 | Kocaman et al. .............. | 702/79 |
| 2005/0163272 A1 * | 7/2005 | Payne et al. .................. | 375/354 |

\* cited by examiner

*Primary Examiner*—David C Payne
*Assistant Examiner*—Vineeta S Panwalkar
(74) *Attorney, Agent, or Firm*—Ryan, Mason & Lewis, LLP

(57) ABSTRACT

Methods and apparatus are provided for clock skew calibration in a clock and data recovery system. One aspect of the invention compensates for skew among a plurality of clocks in a clock and data recovery system. The clocks are applied to a plurality of latches to sample an incoming signal. A reference signal, such as a Nyquist signal, is applied to a data input of each of the latches. Statistics of "early" and "late" corrections applied to at least one of the clocks by a bang-bang phase detector in the clock and data recovery system are evaluated and a delay of a clock buffer associated with the at least one clock is adjusted to obtain approximately a 50% early-to-late ratio for the at least one clock. The clock and data recovery system ensures that the early-to-late ratio for the sum of the plurality of clocks is approximately 50%.

20 Claims, 4 Drawing Sheets

LOOP ENSURES A+B=50% EARLY AND
50% LATE PHASE ERROR INDICATIONS

A
70% EARLY AND
30% LATE PHASE
ERROR INDICATIONS

B
30% EARLY AND
70% LATE PHASE
ERROR INDICATIONS

LOOP ENSURES A+B+C+D=50% EARLY AND
50% LATE PHASE ERROR INDICATIONS

METHOD AND APPARATUS FOR CLOCK SKEW CALIBRATION IN A CLOCK AND DATA RECOVERY SYSTEM USING MULTIPHASE SAMPLING

FIELD OF THE INVENTION

The present invention is related to techniques for clock and data recovery (CDR) and, more particularly, to methods and apparatus for generating and aligning different phases of a clock signal.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases (also known as a multi-phase clock). In one typical implementation, the different clock signals are generated by applying the reference clock signal to a delay network. Thereafter, one or more of the clock signals are compared to the phase and frequency of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). When the voltage controlled delay loops are implemented using integrated circuit technology, an inherent mismatch exists between the various delay stages, causing uneven phase distribution of the multi-phase clock in the generated phases of the clock sources. It has been found that even a small processing mismatch can cause a large percentage mismatch in design output variability. A skew between the individual clock phases translates into eye closure and reduced jitter tolerance margins.

U.S. patent application Ser. No. 11/141,703, entitled, "Parallel Trimming Method and Apparatus for a Voltage Controlled Delay Loop," discloses methods and apparatus for compensating for mismatched latch buffers associated with each delay element in the VCDL loop. The disclosed trimming process trims a plurality of delay units in a VCDL, where each delay unit comprises a delay element and a latch buffer. A reference signal, for example, from a central interpolator, is applied to each of the delay units and a position of an edge associated with each of the delay units, such as a rising or falling edge, is identified. The edges of the delay units are then aligned by adjusting a trim setting of the respective latch buffer.

The same clock is applied as the reference signal to all the clock buffer paths, and an interpolator can be used to move the reference signal. While the disclosed trimming process effectively compensates for mismatched latch buffers, the disclosed techniques may change the delay of the latch buffer, because the reference signal for calibration will not have the same amplitude and slew rate as the signal used in steady-state data recovery. In addition, resistance-capacitance (RC) delays associated with the routing of the reference signal may affect the arrival of the clock edges at the clock buffers.

A need therefore exists for improved clock skew calibration techniques for a clock and data recovery system.

SUMMARY OF THE INVENTION

Generally, methods and apparatus are provided for clock skew calibration in a clock and data recovery system. One aspect of the invention compensates for skew among a plurality of clocks in a clock and data recovery system. The clocks are applied to a plurality of latches to sample an incoming signal. A reference signal, such as a Nyquist signal, is applied to a data input of each of the latches. Statistics of "early" and "late" corrections applied to at least one of the clocks by a bang-bang phase detector in the clock and data recovery system are evaluated and a delay of a clock buffer associated with at least one clock is adjusted to obtain approximately a 50% early-to-late ratio for the at least one clock. The clock and data recovery system ensures that the early-to-late ratio for the sum of the plurality of clocks is approximately 50%.

In an exemplary two UI sampling system, a phase of a first clock is adjusted and the clock and data recovery system automatically adjusts a phase of a second clock to ensure that the early-to-late ratio for the sum of both clocks is approximately 50%. The sample clocks can also be phase aligned with the transition clocks by (i) digitally re-mapping latch outputs in the bang-bang phase detector, such that one or more sample clocks become transitions clocks, and one or more transition clocks become sample clocks; (ii) applying a reference signal that is twice a nominal data rate such that transitions are present in the incoming signal on both transition and sample clocks, or (iii) band-limiting the reference signal and positioning the at least one sample clock at a peak of a sinusoid.

In general, for an N UI sampling system, N−2 clocks are temporarily removed and a phase of a first transition clock is adjusted and the clock and data recovery system automatically adjusts a second transition clock to a 50% early-to-late ratio. This process can be repeated for different pairs of transition clocks until each of the N clocks are properly aligned. The N−2 clocks can be temporarily removed, for example, by setting a first clock in a pair of clocks to a minimum delay value and a second clock in the pair of clocks to a maximum delay value or by employing logic switches in a patch between an output of the plurality of latches and a summer in phase detector logic. Thereafter, the sampling clocks can be phase aligned in a similar manner to the two UI implementation.

A more complete understanding of the present invention, as well as further features and advantages of the present invention, will be obtained by reference to the following detailed description and drawings.

DETAILED DESCRIPTION

The present invention provides method and apparatus for clock skew calibration in a clock and data recovery system. Generally, the present invention uses the clock and data recovery system running in a closed loop and steady state mode, to calibrate the clock buffer skew by choosing a specific data pattern to which the clock and data recovery system is locked, and by selectively altering the behavior of the phase detector in order to calibrate specific clock buffers relative to a single clock buffer. The minimal calibration circuitry required does not introduce additional impairments into the measurement, and thus degrade the quality of the measurement and correction of the clock buffer skew.

Figure 1:
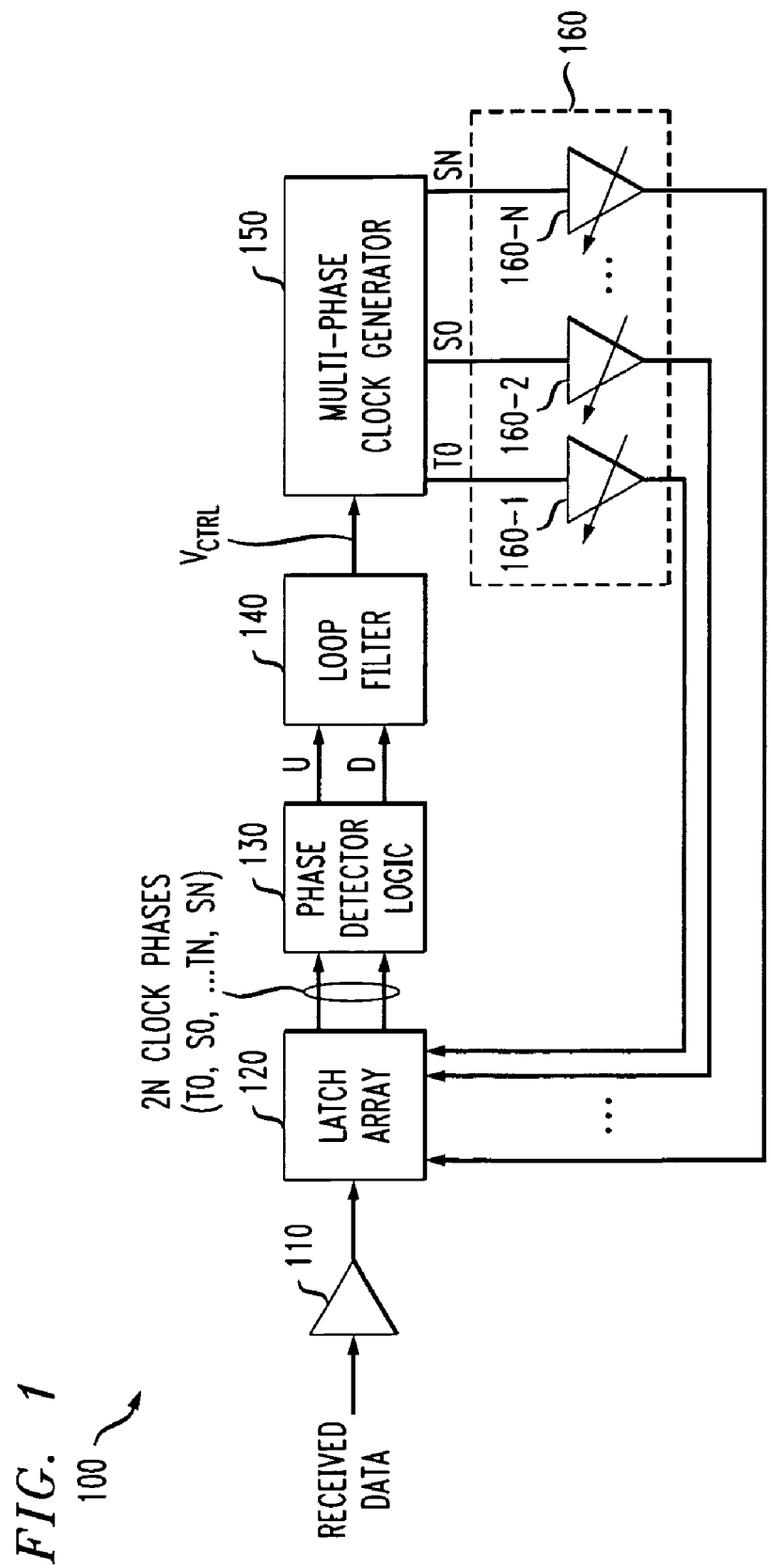
FIG. 1 illustrates an exemplary clock and data recovery system in which the present invention can operate.

FIG. 1 illustrates an exemplary clock and data recovery system 100 in which the present invention can operate. As shown in FIG. 1, the exemplary clock and data recovery system 100 comprises an analog front end (AFE) 110, a latch array 120, phase detector logic 130, a loop filter 140, a multi-phase clock generator 150 and an array 160 of trimmable clock buffers 160-1 through 160-N. The trimmable clock buffers 160 are trimmed by the techniques of the present invention. The latch array 120 and trimmable clock buffers 160 are discussed further below in conjunction with FIG. 3.

The exemplary phase detector logic 130 includes a bang-bang phase detector for each sampled UI, as well as a summer for an implementation that samples multiple UI. The loop filter 140 may be implemented, for example, using analog or digital techniques. In an analog implementation, the loop filter 140 may be embodied as a charge-pump, resistor and integrator capacitor. The charge pump (not shown) generates a positive or negative current pulse based on the detected phase difference. The current pulse generated by the charge pump is integrated by a loop filter, such as a resistor and capacitor, in a known manner.

In a digital implementation, a digital filter (not shown) can alternatively process the output of the bang-bang phase detector. The digital filter replaces the charge-pump, resistor and integration capacitor. Assuming the bang-bang phase detector generates a value of +1 (i.e., upward control signal U is asserted) to indicate that the late clock lags the early data, and a value of -1 (i.e., downward control signal D is asserted) to indicate that the early clock leads the late data, the digital filter will add the generated values of +1 and -1 and produce an N bit digital word that is applied to a digital-to-analog converter. For example, in an 8 bit implementation, the output of the digital filter will vary between 0 and 255. The digital-to-analog converter generates the control voltage, VCTRL, based on the digital word. The digital filter operates in a manner that is well understood by those of ordinary skill in the art.

The loop filter 140 generates a voltage control signal, VCTRL, that controls the generation of a plurality of phase shifted clock signals by the multi-phase clock generator 150. The multi-phase clock generator 150 may be implemented, for example, as a voltage controlled delay line (VCDL) or an oscillator with one or more divide-by-N circuits to generate the multiple phase clocks. Such implementations of multi-phase clock generators 150 are well known to those of ordinary skill in the art and are outside the scope of the present invention. Generally, the voltage controlled delay line can be embodied, for example, using the VCDL circuits described in U.S. patent application Ser. No. 10/999,900, filed Nov. 30, 2004, entitled, "Voltage Controlled Delay Loop and Method with Injection Point Control," incorporated by reference herein. A VCDL is typically comprised of a cascaded chain of delay elements (not shown), each having a nominal delay value that is controlled by the control voltage, VCTRL, to produce a plurality of phase shifted clock signals. In an implementation that employs an oscillator, the oscillator generates clocks of a predefined frequency, such as two clocks having offset phases and a full rate frequency. If the output of the oscillator is applied to a divide-by-two circuit four phases at a half-rate frequency are produced.

Generally, the phase detector logic 130 determines the time difference (magnitude and/or polarity) between rising edges of the clock signals generated by the multi-phase clock generator 150, and the incoming data stream. If the phase detector logic 130 detects that the late clock lags the data, the phase detector logic 130 generates an upward control signal, U. Likewise, if the phase detector logic 130 detects that the early clock leads the data, the phase detector logic 130 generates a downward control signal, D. For a more detailed discussion of bang-bang phase detectors, see, for example, see J. D. H. Alexander, "Clock Recovery From Random Binary Data," Electronics Letters, vol. 11, 541-542 (October 1975), incorporated by reference herein.

As discussed further below, a clock and data recovery system using such a bang-bang phase detector will phase lock to the point where 50% of the phase error indications are "early" and 50% of the phase error indications are "late." If the phase detector is running at the data rate, and a Gaussian distribution of jitter is assumed for the incoming signal, the clock can be considered to be centered at the peak of the Gaussian distribution, so there are 50% "early" phase error indications and 50% "late" phase error indications. Alternatively, without loss of generality, one can assume a Gaussian distribution of the clock jitter, which would mathematically include all the jitter in the incoming signal. This latter method is used in the following discussion. As understood by those of ordinary skill in the art, specific data patterns and inter-symbol interference in the incoming data stream may require a sufficiently long averaging interval to achieve the desired 50% ratio of early-to-late phase error indications.

Figure 2:
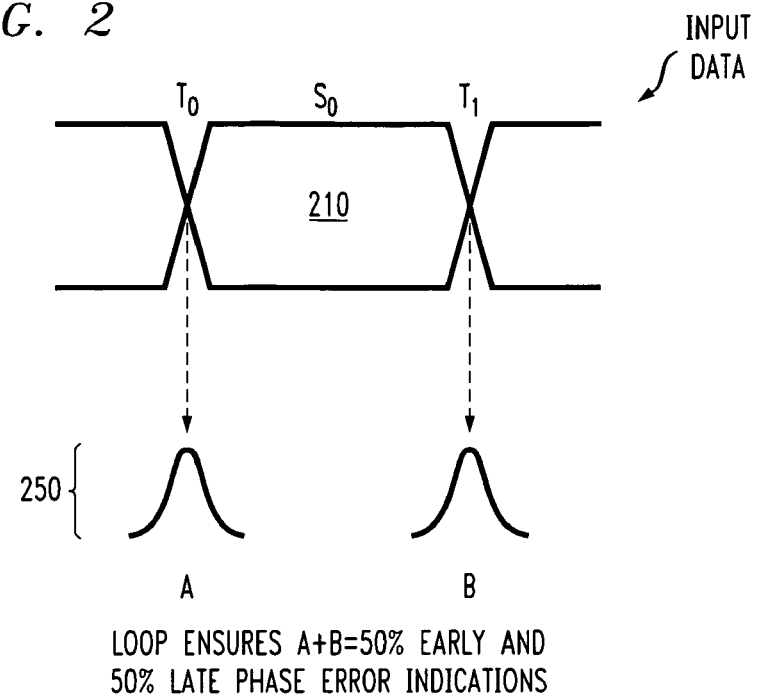
FIG. 2 graphically illustrates a data eye associated with a received signal for an exemplary two unit interval (UI) sampling implementation.

FIG. 2 graphically illustrates a data eye 210 associated with a received signal for an exemplary two UI implementation. It is noted that for purposes of illustration, the input data in FIG. 2 does not move. In a system where multi-phase clocks are used to sample two data eyes 210 simultaneously, then two clocks, each with their own Gaussian distribution 250, are used to sample to incoming data stream, to collect the required "early" and "late" samples. As shown in FIG. 2, the clocks T0 and T1 are used to sample the incoming signal at the transitions, and the clocks S0 and S1 (not shown) are used to recover the data symbols.

FIG. 2 also includes a histogram 250 that is used to statistically evaluate the phase deviation of each clock (i.e., the ratio of early/late corrections). As shown in FIG. 2, the statistical variations in phase are assumed to be Gaussian. A is the ratio of the early/late phase corrections for clock T0 and B is the ratio of early/late phase corrections for clock T1. It is a well-known property of the clock and data recovery system 100 of FIG. 1 that the loop will ensure that the sum of the ratios A and B has 50% early phase corrections and 50% late phase corrections. The present invention recognizes, however, that each individual clock should also have a ratio of 50% early phase corrections and 50% late phase corrections, when the T0 and T1 clocks are properly separated in time. The statistics employed by the present invention can be obtained in a manner discussed further below in conjunction with FIG. 5.

Figure 3:
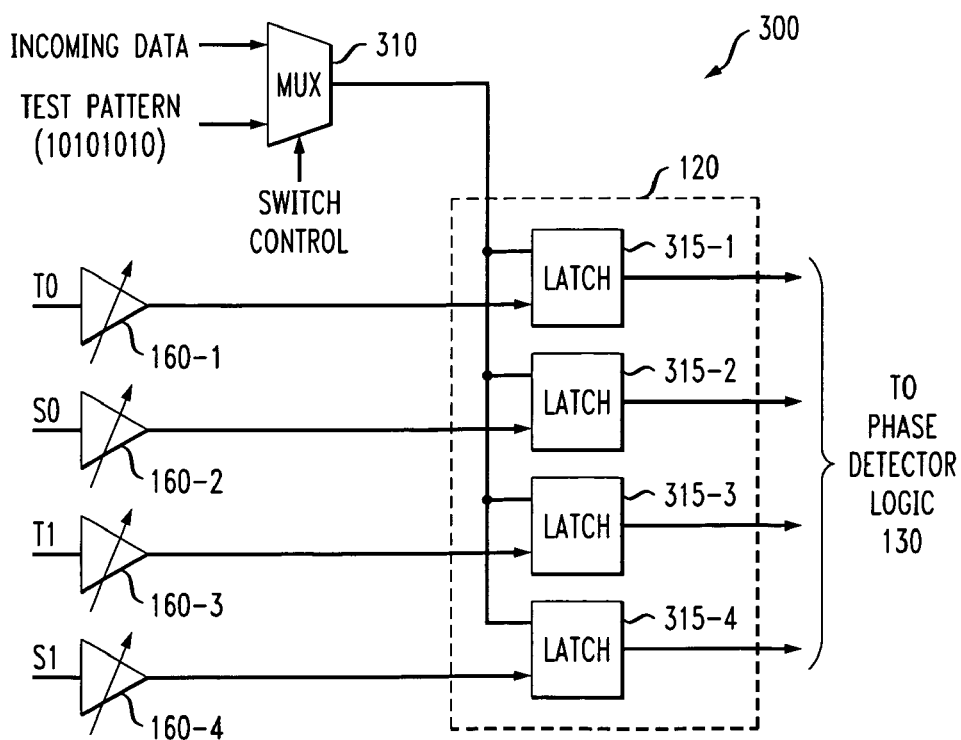
FIG. 3 illustrates the latch array and trimmable clock buffers of FIG. 1 in further detail.

FIG. 3 illustrates the latch array 120 and trimmable clock buffers 160 of FIG. 1 in further detail. The clock signals T0 through SN from the multi-phase clock generator 150 of FIG.

1 are applied to the corresponding trimmable clock buffers 160 and then the clock inputs of corresponding latches 315-1 through 315-4, which sample the incoming data stream that is applied to the latch data inputs. The latches 315-1 through 315-4 sample the incoming data stream over a period of two unit intervals (UIs), or two data eyes 210. The latches 315-1 through 315-4 may be embodied, for example, as D-type flip flops, having clock and data inputs and a "Q" output. As shown in FIG. 3, the outputs of the latches 315-1 through 315-4 are applied to the phase detector logic 130. As shown in FIG. 3, a multiplexer 310 allows the input stream to be selected in a normal operating mode and a test pattern to be selected in a trimming mode, based on a control signal. As discussed further below, the test pattern preferably comprises a Nyquist pattern of alternating ones and zeroes (101010). The output of multiplexer 310 can optionally be amplified and equalized (not shown) before being applied to the latch array 120.

Figure 4:
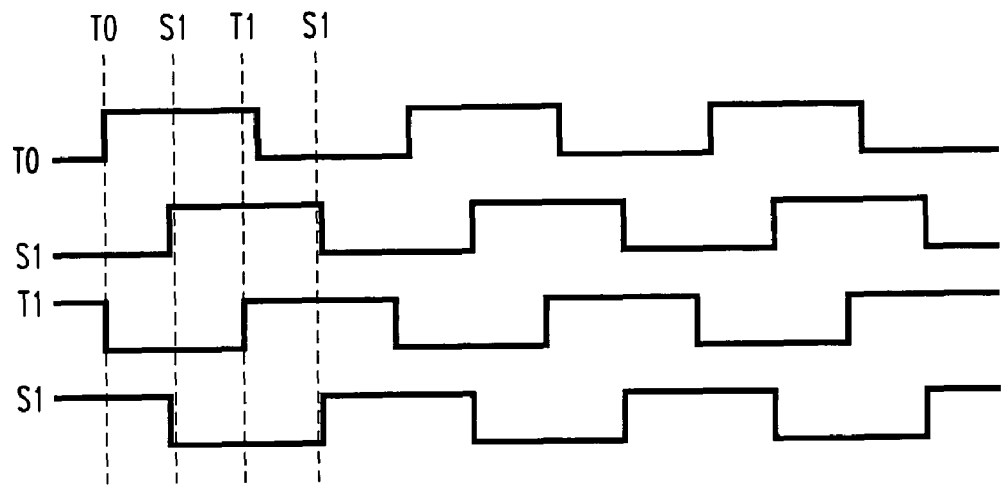
FIG. 4 illustrates the clock signals T0, T1, S0, and S1 in further detail.

FIG. 4 illustrates the clock signals T0, T1, S0, and S1 in further detail. Generally, for two UI sampling, the frequency of the clock signals is half the frequency of the incoming data stream. In general, each clock signal is phase shifted from one another by one half of a unit interval.

Figure 5:
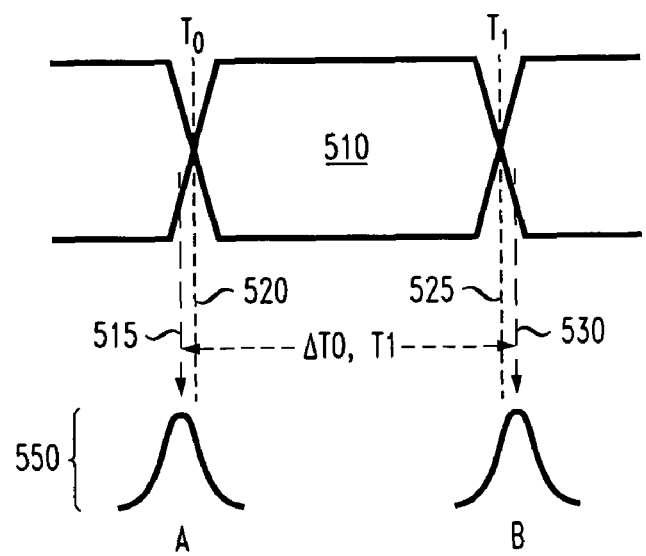
FIG. 5 illustrates a data eye associated with a received signal, as well as a corresponding histogram, in the presence of a phase offset or clock buffer skew.

FIG. 5 illustrates a data eye 510 associated with a received signal, as well as a corresponding histogram 550, in the presence of a phase offset or clock buffer skew. The clock signal T0 has a ratio, A, with more "early" than "late" phase error indications (and the peak 515 of the Gaussian distribution is shifted to the left from the desired central position 520), and the clock signal T1 has a ratio, B, with more "late" than "early" phase error indications (and the peak 530 of the Gaussian distribution is shifted to the right from the desired central position 525).

If the delay of clock buffer 160-1 is less than the delay of clock buffer 160-3, then the clock phases of the corresponding clock signals T0 and T1 at the latches 315-1, 315-3 are too far apart, and a phase offset is present, shown as ΔT0,T1 in FIG. 5.

Since the phase detector logic 130 sums the two phase detector outputs for the transitions clocks T0 and T1 to drive the loop filter, when the phase error indications associated with clocks T0 and T1 are summed, the net result is 50% "early" and 50% "late." The same is true when clock signal T0 has more "late" than "early" phase error indications, and clock signal T1 has more "early" than "late" phase error indications.

The present invention recognizes that the clock buffer skew for each individual clock can be corrected by adjusting the delay of one of the clock buffers 160. For example, if the delay of clock buffer 160-1 is adjusted such that the ratio of "early" to "late" phase error indications for clock T0 is 50%, the ratio of "early" to "late" phase error indications for clock T1 will also change, while the clock and data recovery system 100 is locked in steady state. By adjusting the delay of clock buffer 160-1 when the clock and data recovery system 100 is locked, so that the ratio for clock T0 is as close to 50% as possible, the phase error for clock T1 will automatically be adjusted to maintain the overall early-to-late phase error indication ratio of 50%. In other words, after adjusting the delay associated with clock T0 so that the ratio for clock T0 is as close to 50% as possible, while the loop is locked, the loop will automatically move the pair relative to the data stream to maintain an early-to-late ratio of 50%. Only when the separation in time between T0 and T1 is correct (ΔT0,T1 at desired value), will the early-to-late phase error indication ratio be 50% for each sampler, as well as the overall sum.

As indicated above, the exemplary latches 315-1 through 315-4 are D-type flip flops having a "Q" output. The statistics regarding the ratio of early to late phase corrections can be obtained by sampling the Q outputs of the latches 315. For example, the following truth table can be employed to characterize whether each sample is early or late:

| S0 | T1 | S1 | Status |
|---|---|---|---|
| 1 | 1 | 0 | Clock is early with respect to data |
| 0 | 0 | 1 | Clock is early with respect to data |
| 1 | 0 | 0 | Clock is late with respect to data |
| 0 | 1 | 1 | Clock is late with respect to data |

Figure 6:
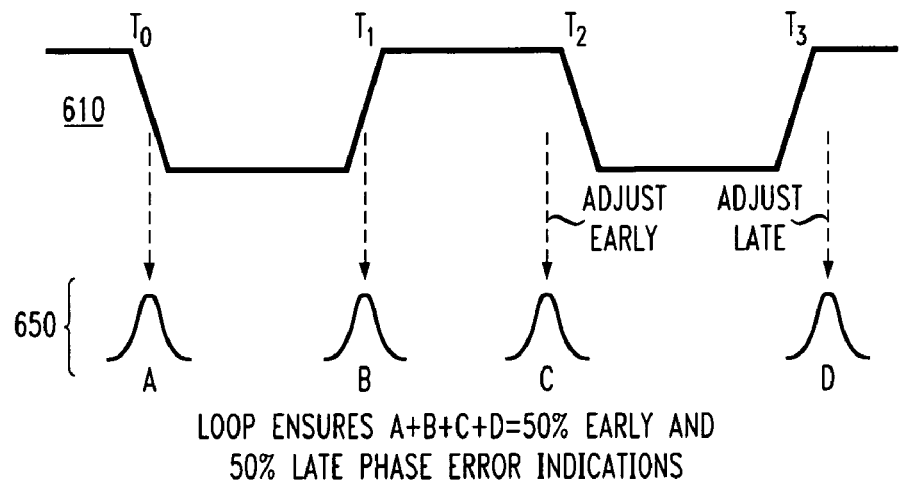
FIG. 6 illustrates the data eyes associated with a received signal for a four UI sampling implementation, as well as the corresponding histogram, in the presence of a phase offset or clock buffer skew.

FIG. 6 illustrates the data eyes 610 associated with a received signal for a four UI sampling implementation, as well as the corresponding histogram 650, in the presence of a phase offset or clock buffer skew. As shown in FIG. 6, the first two transition clocks T0 and T1, having ratios A and B, respectively, of early to late phase corrections, are properly aligned, while the final two clocks T2 and T3, having ratios C and D, respectively, of early to late phase corrections, demonstrate a phase offset or clock buffer skew. The correction of clock buffer skew is more complicated in a four UI implementation because four phase detector outputs are summed to drive the clock and data recovery system loop filter. As with the two UI implementation, it is a property of the clock and data recovery system 100 of FIG. 1 that the loop will ensure that the sum of the ratios A+B+C+D has 50% early phase corrections and 50% late phase corrections.

The present invention recognizes that the clock buffer skew correction in a four UI implementation is reduced to that of two UI sampling described above in conjunction with FIG. 5, by temporarily removing two clock buffers from the skew correction process and only addressing two clock buffers at a time. In this manner, one clock can be selected as the normalized clock, and the remaining three clocks can be successively aligned to the normalized clock.

In one exemplary implementation, two clock buffers can be temporarily eliminated by adjusting the delay of one clock buffer to its minimum value (beyond the tail of the Gaussian), and adjusting the delay of a second clock buffer to its maximum value (again beyond the tail of the Gaussian), so that the phase error indications from these two phase detectors will cancel one another. Assuming that the bang-bang phase detector generates a value of +1 (i.e., upward control signal U is asserted) to indicate that the late clock lags the data, and a value of −1 (i.e., downward control signal D is asserted) to indicate that the early clock leads the data, then when one clock is set to a minimum value and another clock is set to a maximum value the sum of the C=−1 and D=+1 values will equal zero, and thus have no impact on the loop. In this manner, the CDR loop will drive the two remaining clocks, in the same manner as discussed above in conjunction with FIG. 5.

For example, the delay of the clock buffer associated with clock T2 can be reduced to its minimum value, and the delay of the clock buffer associated with clock T3 can be increased to its maximum value, so that the phase error indications from these two phase detectors will cancel, as the first clock signal is always "early" and the second clock signal is always "late." Thus, the CDR loop is driven solely by the two remaining phase detectors associated with clocks T0 and T1 and the problem reduced to the 2UI sampling case described above. If T0 is selected as the normalized clock, T1 is first adjusted so that it has an early-to-late ratio of 50%, and then T0 will automatically settle of a 50% ratio. Thereafter, T1 and T3 can be disabled and the T0/T2 pair will settle to 50%. Finally, T1 and T2 can be disabled and the T0/T3 pair will settle to 50%.

In a further variation, two clock buffers can be temporarily eliminated by using logic switches (not shown) in the path between the output of the latch array 120 and the summer in the phase detector logic 130. In this manner, each latch output can be selectively disabled.

As indicated above, the input data pattern is preferably a 101010 NRZ data stream (i.e., a Nyquist signal). This provides the significant advantages of a 100% transition density and no inter-symbol interference. The 100% transition density allows any two of the four phase detectors to be selectively disabled, while ensuring a sufficient transition density for the CDR to lock. Inter-symbol interference can affect the shape of the Gaussian. It also means that the phase detectors used won't necessarily see the same number of transitions in a given period of time, as the presence of ISI requires that there is not a 100% transition density, and thus the transitions can happen in any of the four available spots and not with a uniform density. By using a 10101 data pattern, there are plenty of transitions for the T0-T3 samplers/phase detectors, and that the CDR will acquire and maintain phase lock.

Clock Skew Correction for Sampling Clocks

In one exemplary implementation, clock skew in the sampling clocks can be corrected by digitally re-mapping the latch outputs to the appropriate phase detector logic inputs, such that the sample clocks become transitions clocks, and vice versa. In this manner, all of the sample clocks can be aligned to each other (this does not, however, align the sample clocks to the transition clocks).

Figure 7:
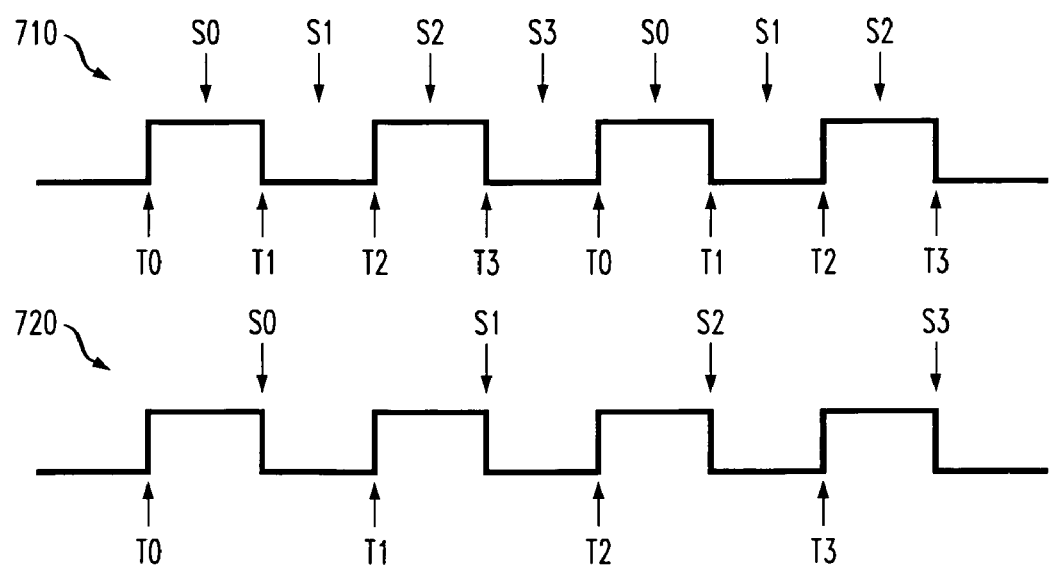
FIG. 7 illustrates a first Nyquist pattern at the normal data rate, and a second Nyquist pattern at twice the normal data rate for calibration of the sampling clocks.

In a further variation, the sampling clocks can be calibrated by generating a calibration signal that is twice the nominal data rate expected by the clock and data recovery system and hard coding each phase detector, such that each transition clock, $T_n$, is forced to lock to rising or falling edges. For example, as shown in FIG. 7, a first pattern 710 illustrates a Nyquist pattern at the normal data rate, and a second pattern 720 illustrates the Nyquist pattern at twice the normal data rate. In this manner, the clock and data recovery system is slowed down. This places transitions in the incoming signal on both the transition and sample clocks, one having falling edges and the other rising edges, or vice versa, as shown by the pattern 720. In an alternate embodiment, rather than actually generating a calibration signal that is twice the frequency, another solution inserts a divide-by-2 function in the feedback path of the CDR (for example, after an oscillator) and the latch array 120 runs at half the rate it would be run at for normal data. Assuming the loop is still stable, the lower clock rate should have no impact on clock buffer skew. Assuming that the clocks are square waves, and not sinusoids, the frequency of the clock has little bearing on the propagation delay, or variation in it, of the clock buffer, provided each clock signal settles to a DC value following each rising and falling edge.

In a further variation, the sampling clocks can be calibrated by band-limiting the calibration signal (101010 at the data rate) so that it contains only the fundamental term of the associated Fourier series (i.e., a sinusoid), and none of the harmonics that tend to make the signal a square wave. The CDR will lock with the zero crossings centered on the transition clocks, and the peak of the sinusoid will be centered exactly in between two adjacent transition clocks, such as T0 and T1. In one exemplary implementation, the resulting sinusoid is sampled using one or more latches and the latch thresholds are adjusted until the sinudoid peak is found. Thereafter, the sampling clock, such as clock S0, is positioned at the determined peak. For example, if the vertical offset of the latch on the sample clock (a reference voltage) can be adjusted, then when combined with the clock buffer skew adjust for the clock, the latch position can be moved up and down, and forward and backward in time to find the peak of the sinusoid, and center the sample latch clock in between the transition latch clocks.

The functions described herein can be implemented on an integrated circuit. A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for compensating for skew among a plurality of clocks in a clock and data recovery system, wherein said clocks are applied to a plurality of latches to sample an incoming signal, said method comprising the steps of:
    applying a reference signal to a data input of each of said latches;
    evaluating statistics of "early" and "late" corrections applied to at least one of said clocks by a bang-bang phase detector in said clock and data recovery system;
    adjusting a delay of a clock buffer associated with said at least one of said clocks to obtain approximately a 50% early-to-late ratio for said at least one of said clocks, wherein said clock and data recovery system ensures that a sum of early-to-late ratios for said plurality of clocks is approximately 50%; and
    adjusting a phase of at least one sample clock, wherein said phase of at least one sample clock is adjusted by digitally re-mapping latch outputs in said bang-bang phase detector, such that one or more sample clocks become transitions clocks, and one or more transition clocks become sample clocks.

2. The method of claim 1, wherein said reference signal is a Nyquist signal.

3. The method of claim 1, wherein said statistics comprise a histogram of said "early" and "late" corrections.

4. The method of claim 1, wherein said adjusting said delay step further comprises the step of adjusting a phase of a first of said clocks in a two unit interval (UI) sampling system and said clock and data recovery system automatically adjusts a second of said clocks to a 50% early-to-late ratio.

5. The method of claim 4, wherein said first and second clocks are transition clocks.

6. The method of claim 1, further comprising the step of temporarily removing N−2 clocks in an N unit interval (UI) sampling system and wherein said adjusting said delay step further comprises the step of adjusting a phase of a first of said clocks and said clock and data recovery system automatically adjusts a second of said clocks to a 50% early-to-late ratio, wherein N is an integer greater than two.

7. The method of claim 6, wherein N−2 clocks are temporarily removed by setting a first clock in a pair of clocks to a minimum delay value and a second clock in said pair of clocks to a maximum delay value.

8. The method of claim 6, wherein N−2 clocks are temporarily removed logic switches in a patch between an output of said plurality of latches and a summer in phase detector logic.

9. The method of claim 1, wherein said reference signal is twice a nominal data rate such that transitions are present in said incoming signal on both transition and sample clocks.

10. The method of claim 1, wherein said phase of at least one sample clock is adjusted by band-limiting said reference signal and positioning said at least one sample clock at a peak of a sinusoid.

11. A system for compensating for skew among a plurality of clocks in a clock and data recovery system, comprising:
a plurality of latches to sample an incoming signal, each of said latches having a clock input to receive one of said plurality of clocks and a data input for receiving a reference signal;
one or more bang-bang phase detectors for determining whether said plurality of clocks are "early" or "late" with respect to data, wherein said one or more bang-bang phase detectors have a corresponding early-to-late ratio of said "early" and "late" corrections applied to at least one of said clocks; and
a trimmable clock buffer associated with said at least one of said clocks, wherein a delay of said trimmable clock buffer is configured to be adjusted to obtain approximately a 50% early-to-late ratio for said at least one of said clocks, wherein said clock and data recovery system ensures that a sum of early-to-late ratios for said plurality of clocks is approximately 50%, wherein a phase of at least one sample clock is adjusted and wherein said phase of at least one sample clock is adjusted by digitally re-mapping latch outputs in said bang-bang phase detector, such that one or more sample clocks become transitions clocks, and one or more transition clocks become sample clocks.

12. The system of claim 11, wherein said reference signal is a Nyquist signal.

13. The system of claim 11, wherein a phase of a first of said clocks is adjusted in a two unit interval (UI) sampling system and said clock and data recovery system automatically adjusts a second of said clocks to a 50% early-to-late ratio.

14. The system of claim 13, wherein said first and second clocks are transition clocks.

15. The system of claim 11, wherein N−2 clocks in an N UI sampling system are temporarily removed and wherein a phase of a first of said clocks is adjusted and said clock and data recovery system automatically adjusts a second of said clocks to a 50% early-to-late ratio, wherein N is an integer greater than two.

16. The system of claim 15, wherein N−2 clocks are temporarily removed by setting a first clock in a pair of clocks to a minimum delay value and a second clock in said pair of clocks to a maximum delay value.

17. The system of claim 15, wherein N−2 clocks are temporarily removed logic switches in a patch between an output of said plurality of latches and a summer in phase detector logic.

18. The system of claim 11, wherein said reference signal is twice a nominal data rate such that transitions are present in said incoming signal on both transition and sample clocks.

19. The system of claim 11, wherein said phase of at least one sample clock is adjusted by band-limiting said reference signal and positioning said at least one sample clock at a peak of a sinusoid.

20. A clock and data recovery system, comprising:
a plurality of latches to sample an incoming signal, each of said latches having a clock input to receive one of said plurality of clocks and a data input for receiving a reference signal;
one or more bang-bang phase detectors for determining whether said plurality of clocks are "early" or "late" with respect to data, wherein said one or more bang-bang phase detectors have a corresponding early-to-late ratio of said "early" and "late" corrections applied to at least one of said clocks; and
a trimmable clock buffer associated with said at least one of said clocks, wherein a delay of said trimmable clock buffer is configured to be adjusted to obtain approximately a 50% early-to-late ratio for said at least one of said clocks, wherein said clock and data recovery system ensures that a sum of early-to-late ratios for said plurality of clocks is approximately 50%, wherein a phase of at least one sample clock is adjusted and wherein said phase of at least one sample clock is adjusted by digitally re-mapping latch outputs in said bang-bang phase detector, such that one or more sample clocks become transitions clocks, and one or more transition clocks become sample clocks.

* * * * *